(12) United States Patent
Kong et al.

(10) Patent No.: US 6,851,101 B1
(45) Date of Patent: Feb. 1, 2005

(54) METHOD FOR COMPUTING AND USING FUTURE COSTING DATA IN SIGNAL ROUTING

(75) Inventors: Raymond Kong, San Francisco, CA (US); Jason H. Anderson, Toronto (CA)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/600,857

(22) Filed: Jun. 19, 2003

Related U.S. Application Data

(60) Provisional application No. 60/390,654, filed on Jun. 20, 2002.

(51) Int. Cl.[7] .............................................. G06F 17/50
(52) U.S. Cl. ............................. 716/12; 716/13; 716/14
(58) Field of Search ........................... 716/1–14, 16–18

(56) References Cited

U.S. PATENT DOCUMENTS

| | | | |
|---|---|---|---|
| 5,757,656 A | * 5/1998 | Hershberger et al. | 716/13 |
| 6,006,024 A | * 12/1999 | Guruswamy et al. | 716/12 |
| 6,424,959 B1 | * 7/2002 | Bennett et al. | 706/13 |
| 6,501,297 B1 | 12/2002 | Kong | |
| 6,516,455 B1 | * 2/2003 | Teig et al. | 716/7 |
| 6,678,876 B2 | * 1/2004 | Stevens et al. | 716/12 |

OTHER PUBLICATIONS

U.S. Appl. No. 10/600,857, filed Jun. 19, 2003, inventor Kong et al.
J. Soukup; "Fast Maze Router"; Proceedings of Design Automation Conference, 1978; pp. 100–102.
Bryan T. Preas et al.; "Physical Design Automation of VLSI Systems"; The Benjamin/Cummings Publishing Company, Inc.; Copyright 1988; pp. 163–167.

* cited by examiner

*Primary Examiner*—Vuthe Siek
*Assistant Examiner*—Binh Tat
(74) *Attorney, Agent, or Firm*—H. C. Chan; LeRoy D. Maunu

(57) ABSTRACT

A systematic method for calculating future cost is disclosed. Pre-routing is performed from a source node to other nodes through a series of neighboring nodes. At each node in the pre-routing, the cumulative routing cost and Manhattan distance are calculated. This cumulative routing cost is used as a new future cost for a specific distance if it is lower than or there is no existing future cost for that distance. A table can be used to store the future cost data. During routing, the recorded future cost is added to the cumulative cost of a node to help guide the routing, improving router run-time.

25 Claims, 4 Drawing Sheets

… (US 6,851,101 B1)

METHOD FOR COMPUTING AND USING FUTURE COSTING DATA IN SIGNAL ROUTING

REFERENCE TO RELATED APPLICATIONS

This application claims benefit of Provisional Application No. 60/390,654 filed Jun. 20, 2002.

FIELD OF THE INVENTION

The present invention relates to programmable logic devices (PLDs), and more particularly to a method for routing signals in programmable logic devices.

BACKGROUND OF THE INVENTION

A programmable logic device (PLD) is a digital circuit implementation platform that can be configured by the end user to implement a logic circuit of their choice. The two most common types of PLDs are field-programmable gate arrays (FPGAS) and complex programmable logic devices (CPLDs). Many PLD vendors provide computed-aided design tools to help their customers to implement logic designs in their PLDS. One type of PLD, the FPGA, is used as an example to illustrate the present invention. It should be noted that, in addition to PLDs, the present invention is applicable to other integrated circuit implementation technologies, for example, application specific integrated circuits (ASICs), mask-programmed gate arrays and standard cell devices.

In a typical architecture, an FPGA includes an array of configurable logic blocks (CLBs) surrounded by programmable input/output blocks (IOBs). The CLBs and IOBs are interconnected by a hierarchy of programmable routing resources, which are comprised of metal wire segments and programmable routing switches, also referred to as programmable interconnection points (PIPs). These CLBs, IOBs, and programmable routing resources are customized by loading a configuration bitstream into the FPGA. State-of-the art FPGAs contain tens of thousands of CLBs. For such devices, the task of establishing the required interconnections between the primitive cells inside a CLB and between the CLBs themselves becomes so onerous that it can only be accomplished with the assistance of computed-aided design tools. Accordingly, the manufacturers of FPGAS, including the assignee hereof, Xilinx, Inc., have developed place and route software tools which may be used by end customers to implement their respective designs in their FPGAs.

The time to execute conventional routing software (also called a router) can be very long, e.g., many hours. A typical design needs numerous iterations in testing and modification, and each iteration requires running the routing software. As a result, design cycles are affected by the execution time of the routing software. Consequently, there is a need to improve the execution time of routing software.

SUMMARY OF THE INVENTION

"Future costing" is a well-known method used to improve the run-time required to route signals in integrated circuits. The present invention involves a new method for determining and using future cost in routing. To the router, the integrated circuit interconnect is modeled using a routing graph, containing a set of nodes and directed edges. The nodes in the graph represent conductors in the integrated circuit. Edges are present between nodes that correspond to conductors that can be electrically connected to one another. In one embodiment of the present invention, a two-dimensional table is used to store future cost data. The entries in the table are indexed by x and y distances between nodes in the routing graph. To populate the table with future cost values, pre-routing is performed from a specially chosen source node to other nodes in the routing graph. At each node visited during pre-routing, both the cumulative routing cost and the x and y distances from the source node are computed. If there is no entry in the table that corresponds to the specific x, y-distance, the cumulative routing cost is entered into the corresponding position in the table. If the table contains existing future cost data corresponding to this distance, the table entry is set equal to the cumulative routing cost if the cumulative routing cost is less than the value of the existing future cost data. Otherwise, the existing future cost remains. The normal routing of a user's signals commences after the pre-routing is completed. During routing, values from the future cost table are used to reduce the run-time needed for routing a design's signals.

The above summary of the present invention is not intended to describe each disclosed embodiment of the present invention. The figures and detailed description that follow provide additional example embodiments and aspects of the present invention.

DETAILED DESCRIPTION OF THE INVENTION

Figure 1:
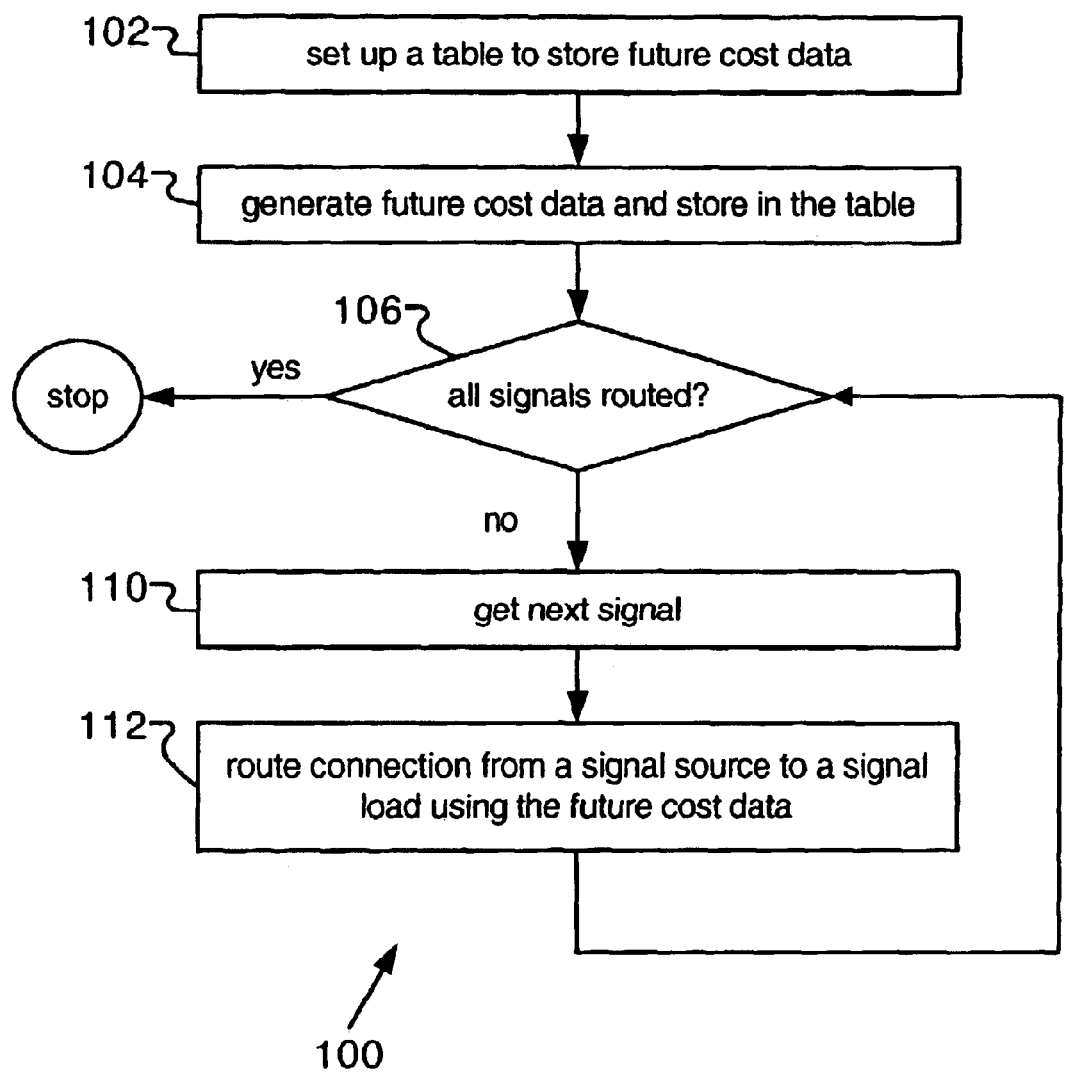
FIG. 1 is a flow chart showing an exemplary routing process of the present invention.

The present invention relates to a new method for routing signals, In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

A widely used algorithm used for routing signals in PLD devices is a variant form of the well-known maze router, as described in C. Y. Lee, "An Algorithm for Path Connections and its Applications," in IRE Trans. on Electronic Computers, Vol. EC=10, 1961, pp. 346–365. This technique is general and adapts very well to some PLD interconnect architectures, such as the FPGA routing fabric. From the router's perspective, the integrated circuit interconnect as modeled by a "routing graph", containing a set of nodes and directed edges. The nodes in the routing graph represent conductors in the integrated circuit. Edges are present between nodes that correspond to conductors that can be electrically connected to one another. For example, in FPGA devices, edges are present between nodes corresponding to conductors that may be connected to each other through a programmable routing switch. A signal in a design is a set of pins that must be connected together electrically. A signal is generally comprised of a source pin and one or more load pins. The pins on a signal correspond to specific nodes in the routing graph. To route a signal, the router identifies paths between the signal's pin nodes in the routing graph. The maze router algorithm searches for a path between a signal source pin and load pins by performing a breadth first search on the routing graph. Nodes in the routing graph are assigned costs, corresponding to characteristics of their corresponding conductors (described below). The maze router's goal is to find the minimum cost path between a signal's source pin and its load pin(s). In general, the maze router is effective in finding high-quality solutions. Its main disadvantage is poor run-time performance.

To improve run-time performance, the concept of "future costing" was introduced, a description of it can be found in Soukup, "Fast Maze Router," Proceedings of Design Automation Conference 1978, pp. 100–102. The basic idea in future costing is to use a new cost value (the future cost) to speed up the maze router by pruning and reducing its search space while maintaining the quality of its solution. Future costing works in the following way: as the maze router searches for a path in the routing graph between a signal's source pin and one of its load pins, it considers using various nodes from the routing graph in the path to the load pin. As mentioned above, each of these nodes has a certain intrinsic routing cost, which reflects the delay of the node, its length, capacitance or other criteria. To this intrinsic cost, a future cost is added. The future cost for a node is a lower bound on the cost of the complete path from the node to the target pin being routed. Consequently, the nodes that have low future costs are likely to be the ones used in low-cost paths to the load pin being routed. Future costing can be thought of as guiding the maze router towards low-cost routing solutions. By exploring favorable paths first and postponing others, it effectively reduces the search space of the maze router. One key aspect of developing a future cost function is to ensure that it does not result in the pruning of high-quality routing solutions and thus damaging the router's quality of result. This condition is met when the future cost is an accurate lower bound on the path cost from a node to the target being routed. A problem that arises with the use of future cost is that there is no systematic way to determine the future cost function that specifies the future cost values used during routing. The development of a future cost function for a router has historically required a certain amount of "black magic". Many engineering hours need to be spent in pouring over device routing architectures and developing heuristics and experimental parameters in order to arrive at the future cost function. For each device family and speed grade, there is a set of device specific future cost functions that have to be designed and developed from scratch. once in place, these future cost functions are effective in reducing the overall router run-time, usually by a significant factor. The downside of the conventional method of developing such functions is that the science is not exact, and it is extremely consuming in engineering time.

One aspect of the present invention is a new future costing approach. This approach not only provides similar or better run-time improvements as prior approaches, but it is generic and is not device specific. Once this new future cost mechanism is in place, all device families can leverage from and use the same machinery to reap significant run-time benefits.

FIG. 1 is a flow chart of an exemplary routing process 100 of the present invention. In step 102, a two-dimensional array (which can be implemented as a simple table, called herein the future cost table) is set up to store future cost data. In step 104, all the future cost data that will be used in subsequent steps is generated. In step 106, process 100 determines whether all the signals have been routed. If all have been routed, process 100 terminates. If signals remain to be routed, the next signal is obtained (step 110). In step 112, the future cost data (obtained from step 104) is used to route a connection between the selected signal's source pin its load pins. Process 100 then returns to step 106.

One novel aspect of the present invention is how the future cost values are calculated. In the present invention, these values are generated dynamically, and they accurately represent the low-bound estimated cost to complete a route from a given node to a target pin node. In one embodiment, to populate the values of the future cost table, pre-routing on an empty device is performed without any signal obstructions. The table (mentioned in step 102) is used to record the minimum costs required to route from a pre-defined source to all nodes in the device.

Figure 2:
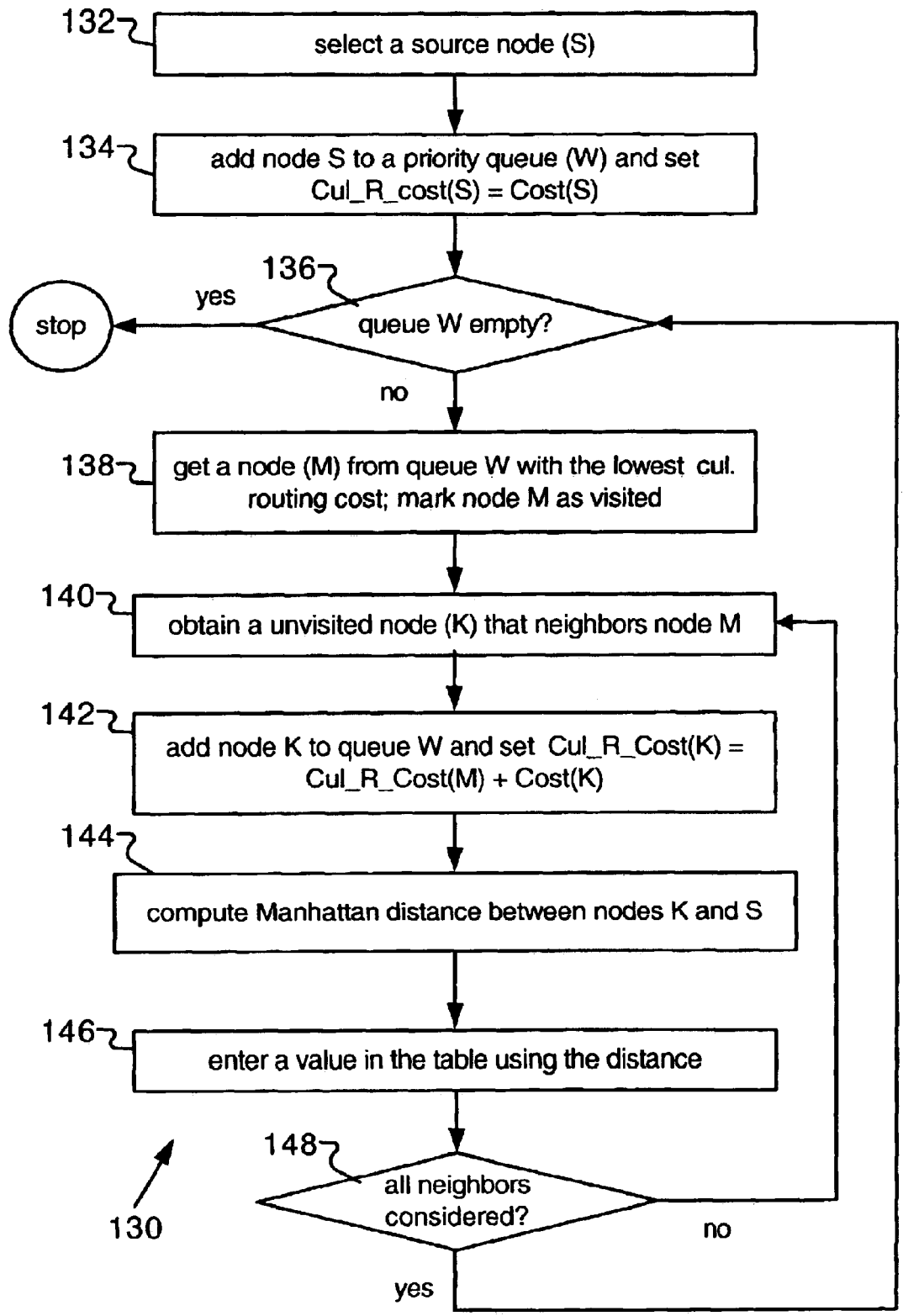
FIG. 2 is a flow chart showing an exemplary process that can be used to calculate the future cost in accordance with the present invention.

FIG. 2 shows an exemplary process 130 that can be used to calculate the future cost in accordance with the present invention. Each node in the PLD is assigned a two-dimensional coordinate (X and Y). In this embodiment, it is assumed that each node (e.g., node N) has a cost. The cost is designated as Cost(N). It should be noted that the present invention is applicable to both resource, delay, and other routing costs. Further, node N is also associated with a cumulative routing cost, Cul_R_Cost(N), representing the sum of the individual node costs on a path from the pre-defined source node to the node, N. The formula for computing this cumulative cost will be described below.

In step 132, a source node (S) is selected. In applying this method to an FPGA, a CLB output located in the corner of a FPGA can be selected as the source. The intrinsic routing cost of node S is calculated, and is designated Cost(S) in process 130. In step 134, node S is added to a priority queue (W). The cumulative routing cost of node S, designated as Cul_R_Cost(S), is initially set equal to Cost(S). In step 136, process 130 determines whether queue W is empty. If the queue is empty, process 130 terminates. If the queue is not empty, process 130 obtains a node (M) from queue W that has the lowest cumulative routing cost. This node M is now marked as "visited" (step 138). When step 138 is first performed, source node S is the only node in queue W. It is automatically treated as node M in this iteration. In step 140, process 130 obtains an unvisited node (K) that neighbors node M in the routing graph (there is an edge between nodes K and M in the routing graph). In step 142, node K is added to queue W. This node is now selectable in the next iteration of step 138. The cumulative routing cost of node K is set equal to the sum of the cumulative routing cost of node M, Cul_R_Cost(M), and the routing cost, Cost(K), of node K. This cumulative routing cost will be used in the computation of the cumulative routing cost of node K's neighboring nodes, if node K is selected in a subsequent iteration of step 138. In step 144, process 130 computes the Manhattan distance between nodes K and S. Two distance values (delta X and delta Y) are obtained, one for the x-dimension and one of the y-dimension. These x and y distance values are used to index a value in the future cost table. In step 146, a cost value is entered into the table at a location determined by this coordinate. This cost value is equal to the minimum of the cumulative routing cost of node K (see above in connection with step 142) and the existing future cost value in the table. In step 148, process 130 determines whether all the neighbors of node M have been considered. If not all the neighbors have been considered, process 130 jumps back to step 140 and obtains another unvisited node that neighbors node M. If all the neighbors have been considered, process 130 jumps back to step 136. At the end of process 130, each entry of the future cost table contains a numerical value that represents a lower bound on the cumulative routing cost required to route a specific distance.

Figure 3:
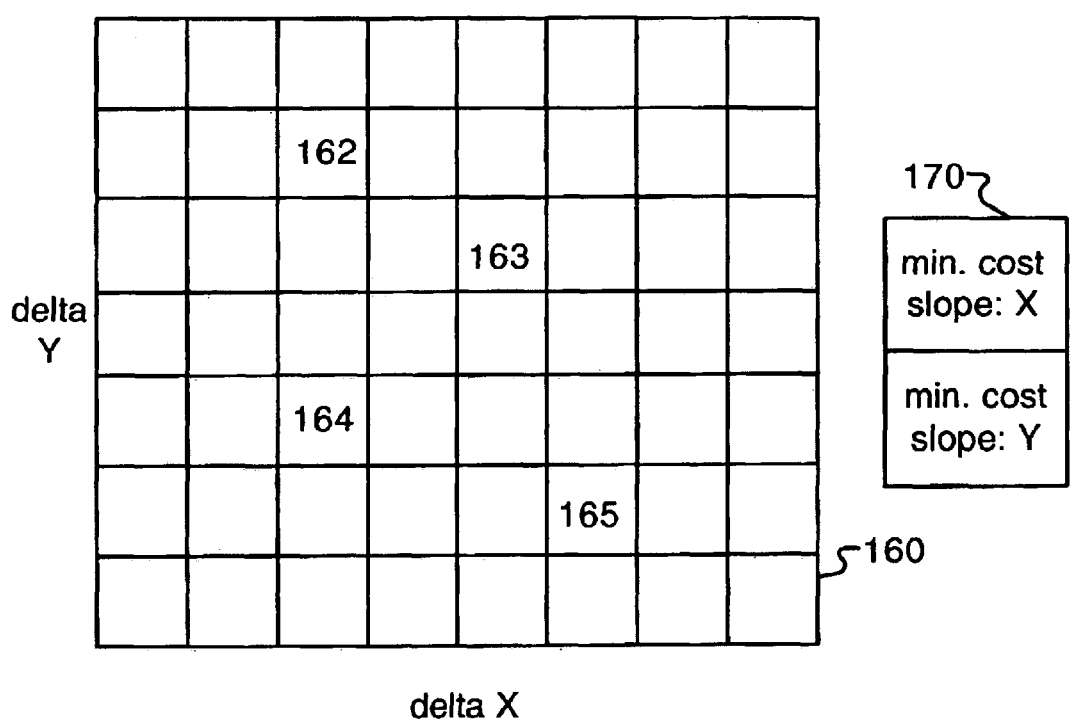
FIG. 3 shows an exemplary future cost table of the present invention.

An exemplary future cost table 160 is shown in FIG. 3. Future cost data are entered into various locations inside table 160, such as locations 162–165.

In summary, the minimum future cost values are stored and organized in a two-dimensional array such that the indices represent the vertical and horizontal Manhattan distances between two nodes. In order to query the future cost value for a target that is M horizontal units and N vertical units away from the current node, one could simply look up and retrieve the value located at array location (M, N). It is important to consider the amount of run-time in executing process 130 of FIG. 2 because it may be significant relative to the overall router run-time required to route all user signals. In the above-described preferred embodiment, a single "expansion" is used to find and record the minimum cost paths from the pre-defined source to each node in the device. Each node in the routing graph is visited at most once in such an expansion procedure. In another embodiment, the future cost table need not be computed at router run-time. The table could be pre-computed using process 130 and its contents stored on disk. When the router is invoked, it would simply read the table from the disk, prior to commencing to route signals. Note that this table may be re-generated whenever the underlying integrated circuit experiences changes in its routing connectivity, or changes in its routing delays, or when the costs assigned to nodes in the routing graph change.

Figure 4:
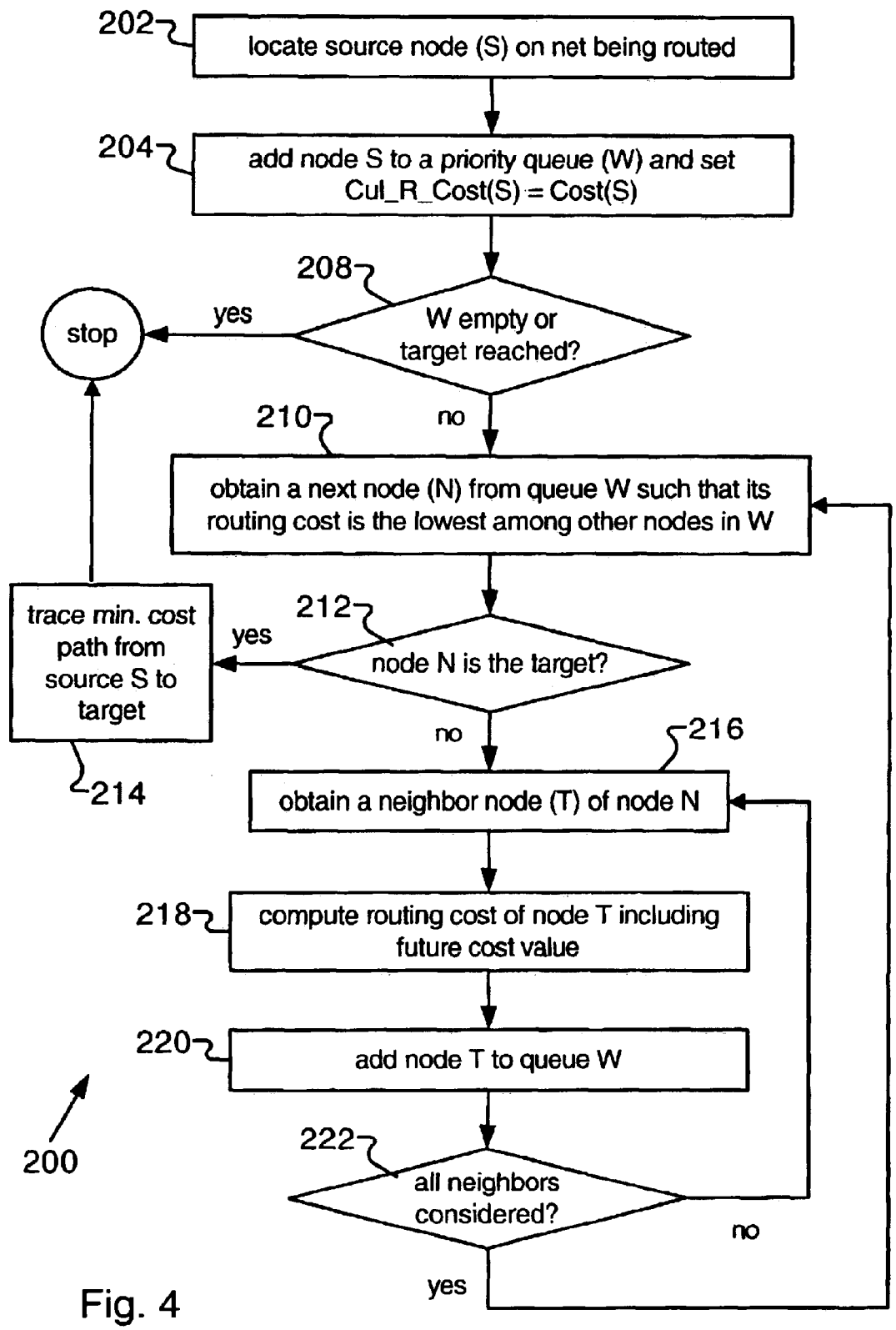
FIG. 4 is a flow chart showing an exemplary process that can be used to route a connection between a signal source pin and a signal load pin using the future cost generated in accordance with the present invention.

A process 200 for routing connections using the future cost of the present invention is shown in FIG. 4. Note that process 200 provides a detailed description of step 112 of FIG. 1. In step 202, the source node S corresponding to the source node or pin of the signal being routed is located. (The signal being routed is identified in step 110 of FIG. 1.) The routing cost of this node is calculated, and is designated Cost(S) in process 200. In step 204, node S is added to a priority queue W. The cumulative routing cost, Cul_R_Cost(S), is initially set equal to Cost(S). In step 208, process 200 determines whether queue W is empty. If the queue is empty, process 200 terminates. If the queue is not empty, process 200 obtains the next node in the routing, node (N), from queue W (step 210). In this embodiment, node N has the lowest cumulative routing cost among all the nodes in queue W. When step 210 is first performed, source node S is the only node in queue W. It is automatically treated as the node N. Process 200 is used for routing from the source pin of a net to a given target load pin on the net. The target load pin has a corresponding target node in the routing graph. In step 212, process 200 determines whether node N is the target node. If this is the target node, the minimum cost routing path can be found by tracing back from this target node to the source node S. If this is not the target node, a neighbor node (T) of node N is obtained (step 216). Node T can be an arbitrary neighbor node because, as explained below, all the neighbor nodes will be considered. The Manhattan distance (in the X and Y directions) between node T and the target node is calculated. These two distance values are used as indices to locate a corresponding entry in the future cost table. The routing cost of node T, Cul_R_Cost(T), is set equal to the sum of the cumulative routing cost of node N, Cul_R_Cost(N), the routing cost of T, Cost(T), and the corresponding entry in the future cost table (step 218). Node T is then added to priority queue W (step 220). This node is now selectable in the next iteration of step 210. The cumulative routing cost Cul_R_Cost(T) will be used in the computation of the cumulative routing cost of its neighboring nodes, if T is selected in a subsequent iteration of step 210. In step 222, process 200 determines whether all the neighbor nodes of node N have been considered. If the answer is negative, process 200 returns to step 216 (obtain another neighbor node of node N). If the answer is positive, process 200 returns to step 210 (obtain another node in queue W).

A different embodiment for generating a future cost table is now described. In order to reduce or limit the run-times of generating the future cost table associated with large devices, the search space of process 130 on the device can be bounded. Pre-defined maximum horizontal and vertical limits, labeled as Max_X and Max_Y, are assigned. This means that the recorded future cost table will contain entries up to Max_X and Max_Y distances from the source. If step 218 of process 200 encounters targets that lay outside of these distance limits, future cost values can be estimated using the entries located in the table, as explained below.

In order to facilitate the estimation, memory locations 170, shown in FIG. 3, can be used to store minimum cost future cost slopes for the x and y dimensions. In this embodiment, the cost slopes are equal to the quotient of dividing the future cost by the corresponding Manhattan distance. When a future cost data value is stored in a future cost table (step 146 of process 130), the cost slope is computed by dividing the current cost with the current x,y-Manhattan distances. A computed cost slope for the x or y dimension will replace its corresponding value in memory location 170 if the computed value is less than the existing value. As a result, at the end of process 130, memory location 170 stores the current minimum cost slope for both the x and y dimensions. A future cost value for a node outside of the distance limit (Max_X, Max_Y) can be computed by multiplying the x,y-Manhattan distances from that node to the target with the minimum cost slope values in memory location 170. In essence, this method provides a conservative lower bound estimation based on known future cost values.

To further increase the accuracy of the future cost values, different types of device nodes can be considered separately. For example, in an FPGA environment, distinctions can be made wire segments of different lengths, for example, long lines, hex lines, double lines, etc. Also, distinctions can be made between different target load pin types, for example, logic block input pins, clock pins, etc. Separate future cost tables can be generated for each type of resource, thus improving the accuracy of the future cost function and further pruning the search space of the router.

This new invention yields improvements in router run-time that are similar or better than prior methods. In addition, the computation of the future cost function is generic and is de-coupled from the device-specific structure of an integrated circuit. Both PLDs and other types of integrated circuit implementation technologies can benefit from this invention.

It can be seen from the above description that a novel routing method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for calculating a future cost for use in routing an integrated circuit, the conductors in the integrated circuit being modeled by a plurality of nodes and at least one source node, the method comprising:

obtaining a first node from the plurality of nodes;

obtaining a second node that can be electrically connected to the first node;

determining a cumulative routing cost of the second node;

calculating a first distance between the second node and the source node, wherein first distance is less than a predetermined value; and setting the future cost equal to the cumulative routing cost if there is no existing future cost that corresponds to the distance or if the cumulative routing cost is less than the existing future cost corresponding to the distance; and calculating a first cost slope as a function of the cumulative routing cost divided by the first distance and recording the first cost slope in a memory location for use as a future cost value associated with a first predetermined maximum distance.

2. The method of claim 1 wherein the first distance is a Manhattan distance.

3. The method of claim 1 wherein the cumulative routing cost of the second node comprises a cumulative routing cost of the first node and a routing cost of the second node.

4. The method of claim 1 wherein the first node is a source node.

5. The method of claim 4 wherein the source node is located at one corner of the integrated circuit.

6. The method of claim 1 further comprising:

recording the first cost slope in the memory location if the first cost slope is smaller than the cost slope value stored in the memory location or if there is no existing cost slope value in the memory location.

7. The method of claim 1 further comprising:

generating a two dimensional array;

calculating a second distance between the second node and the source node, the second distance being in an orientation substantially perpendicular to the first distance; and storing the future cost in a position of the array determined by the first and the second distances.

8. The method of claim 7 wherein the first and the second distances are Manhattan distances.

9. The method of claim 7 wherein the cumulative routing cost of the second node comprises a cumulative routing cost of the first node and a routing cost of the second node.

10. The method of claim 7 wherein the first and the second distances are less than predetermined values.

11. The method of claim 10, wherein the first predetermined maximum distance is in a first dimension and further comprising the step of calculating a second cost slope as a function of the cumulative routing cost divided by the second distance and recording the second cost slope in a memory location for use as a future cost value associated with a second predetermined maximum distance in a second dimension.

12. The method of claim 11 further comprising:

recording the first cost slope in the first memory location if the first cost slope is smaller than the first value in the location; and recording the second cost slope in the second memory location if the second cost slope is smaller than the second value in the location.

13. The method of claim 7 wherein the array is stored in a memory device, and the array is later retrieved from the memory device to perform the routing.

14. A method for calculating a future cost for use in routing an integrated circuit, the conductors in the integrated circuit being modeled by a plurality of nodes, the method comprising:

creating a queue;

placing a source node into the queue; and performing the following steps until the queue is empty:

selecting a low cost node from the queue, the low cost node having lowest cumulative routing cost of all nodes in the queue;

obtaining a neighboring node that can be electrically connected to the low cost node and is unvisited; determining a cumulative routing cost of the neighboring node;

calculating a first distance between the neighboring node and the source node, wherein first distance is less than a predetermined value;

adding the neighboring node to the queue;

setting the future cost equal to the cumulative routing cost if there is no existing future cost that corresponds to the first distance or if the cumulative routing cost is less than the existing future cost;

calculating a first cost slope as a function of the cumulative routing cost divided by the first distance and storing the first cost slope for use as a future cost value associated with a first predetermined maximum distance; and repeating the obtaining, determining, calculating a first distance, adding, setting, calculating a first cost slope, and storing the first cost slope steps until substantially all unvisited nodes neighboring the low cost node have been considered.

15. The method of claim 14 wherein the first distance is a Manhattan distance.

16. The method of claim 14 wherein the cumulative routing cost of the neighboring node comprises a cumulative routing cost of the low cost node and a routing cost of the neighboring node.

17. The method of claim 14 further comprising:

recording the first cost slope in the memory location if the first cost slope is smaller than the cost slope value stored in the memory location.

18. The method of claim 17 further comprising:

generating a two dimensional array;

calculating a second distance between the neighboring node and the source node, the second distance being in an orientation substantially perpendicular to the first distance; and storing the future cost in a position of the array determined by the first and the second distances.

19. The method of claim 18 wherein the first and the second distances are Manhattan distances.

20. The method of claim 18 wherein the first and the second distances are less than predetermined values.

21. The method of claim 20, wherein the first predetermined maximum distance is in a first dimension and further comprising the step of and calculating a second cost slope as a function of the cumulative routing cost divided by the second distance and recording the second cost slope in a memory location for use as a future cost value associated with a second predetermined maximum distance in a second dimension.

22. The method of claim 21 further comprising:

recording the first cost slope in memory location if the first cost slope is smaller than the first value in the location; and recording the second cost slope in memory location if the second cost slope is smaller than the second value in the location.

23. The method of claim 18 wherein the array is stored in a memory device, and the array is later retrieved from the memory device to perform the routing.

24. A method for routing signals in an integrated circuit, the integrated circuit being modeled by a plurality of nodes, the method comprising:

generating an array;

calculating a plurality of future costs and a plurality of associated distances, each of the distances being less than a predetermined value;

storing the plurality of future costs in separate places in the array based on their associated distances;

determining a cost slope using the plurality of future costs and the associated distances;

performing routing being ratio of a cost that includes the plurality of future costs if a distance from a node to a target node is less than the predetermined value and values calculating from the cost slope otherwise.

25. The method of claim 24 wherein the plurality of distances are Manhattan distances.

* * * * *